United States Patent
Canvel et al.

(10) Patent No.: US 11,152,570 B2
(45) Date of Patent: Oct. 19, 2021

(54) ELECTRONIC COMPONENT MANUFACTURING METHOD

(71) Applicant: STMICROELECTRONICS SAS, Crolles (FR)

(72) Inventors: Yann Canvel, Grenoble (FR); Sebastien Lagrasta, La Terrasse (FR); Sebastien Barnola, Villard Bonnot (FR); Christelle Boixaderas, Claix (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 16/578,022

(22) Filed: Sep. 20, 2019

(65) Prior Publication Data
US 2020/0098989 A1 Mar. 26, 2020

(30) Foreign Application Priority Data
Sep. 21, 2018 (FR) ...................... 1858603

(51) Int. Cl.
*H01L 45/00* (2006.01)

(52) U.S. Cl.
CPC .......... *H01L 45/1675* (2013.01); *H01L 45/06* (2013.01); *H01L 45/126* (2013.01); *H01L 45/1233* (2013.01); *H01L 45/144* (2013.01)

(58) Field of Classification Search
CPC combination set(s) only.
See application file for complete search history.

(56) References Cited

U.S. PATENT DOCUMENTS

| 5,384,009 A | 1/1995 | Mak et al. |
| 5,658,425 A | 8/1997 | Halman et al. |
| 8,796,148 B2 | 8/2014 | Leverd et al. |
| 2008/0026586 A1* | 1/2008 | Cho .................. H01L 45/1675 438/695 |
| 2013/0049219 A1* | 2/2013 | Tsai ................. H01L 21/28512 257/774 |
| 2015/0092482 A1* | 4/2015 | Ha ..................... G11C 13/0007 365/163 |
| 2017/0018706 A1* | 1/2017 | Xue .................... H01F 10/3222 |
| 2019/0244641 A1* | 8/2019 | Jamali ................ G11C 11/5657 |

FOREIGN PATENT DOCUMENTS

CN 101768743 A 7/2010

OTHER PUBLICATIONS

Kang et al., "Etch Damage of Ge2Sb2Te5 for Different Halogen Gases," *Japanese Journal of Applied Physics* 50:2011, 4 pages.
Burr et al., "Phase change memory technology," *Journal of Vacuum Sciences and Technology B* 28(2):223-262, 2010.
(Continued)

*Primary Examiner* — Ratisha Mehta
(74) *Attorney, Agent, or Firm* — Seed IP Law Group LLP

(57) ABSTRACT

The disclosure concerns an electronic component manufacturing method including a first step of etching at least one first layer followed, with no exposure to oxygen, by a second step of passivating the first layer.

19 Claims, 2 Drawing Sheets

(56) References Cited

OTHER PUBLICATIONS

Feng et al., "Reactive ion etching of $Ge_2Sb_2Te_5$ in $CHF_3/O_2$ plasma for nonvolatile Phase Change Memory device," *Electrochemical and Solid-State Letters*, 10:D47-D51, 2007.

Feng et al., "Reactive-ion etching of $Ge_2Sb_2Te_5$ in $CF_4/Ar$ plasma for non-volatile phase-change memories," *Microelectronic Engineering* 85:1699-1704, 2008.

Joseph et al., "Patterning of $N:Ge_2Sb_2Te_5$ Films and the Characterization of Etch Induced Modification for Non-Volatile Phase Change Memory Applications," *2008 International Symposium on VLSI Technology, Systems and Applications (VLSI-TSA)*, pp. 142-143, 2008.

Kang et al., "Effect of Halogen-Based Neutral Beam on the Etching of $Ge_2Sb_2Te_5$," *Journal of the Electrochemical Society* 158(8):H768-H771, 2011.

Kang et al., "Etch Damage of $Ge_2Sb_2Te_5$ for Different Halogen Gases," *Japanese Journal of Applied Physics* 50:086501-1-086501-4, 2011.

Li et al., "Direct evidence of reactive ion etching induced damages in $Ge_2Sb_2Te_5$ based on different halogen plasmas," *Applied Surface Science* 378:163-166, 2016.

Li et al., "Optical emission spectroscopy analysis for $Ge_2Sb_2Te_5$ etching endpoint detection in HBr/He plasma," *Proceedings of SPIE—2012 International Workshop on Information Data Storage and Ninth International Symposium on Optical Storage*, Shanghai, China, Jan. 24, 2013. (5 pages).

Min et al., "Etching characteristics and mechanism of $Ge_2Sb_2Te_5$ thin films in inductively coupled $Cl_2/Ar$ plasma," *Journal of Vacuum Science and Technology A* 26:205-211, 2008.

Park et al., "Characteristics of phase transition and separation in a In—Ge—Sb—Te system," *Applied Surface Science* 258:9786-9791, 2012.

Song et al., "A Study of GST Etching Process for Phase Change Memory Application," *2016 China Semiconductor Technology International Conference (CSTIC)*, Shanghai, China, Mar. 13-14, 2016. (3 pages).

Takaura, "Process and device technologies of topological-switching random-access memory (TRAM)," *2014 IEEE International Nanoelectronics Conference (INEC)*, Sapporo, Japan, Jul. 28-31, 2014. (4 pages).

Xia et al., "$CHF_3/O_2$-Based Plasma Reactive Ion Etching of GeTe for Nonvolatile Phase Change Memory," *IEEE Transactions on Semiconductor Manufacturing* 29(2):98-103, 2016.

Yoon et al., "Dry Etching of $Ge_2Sb_2Te_5$ Thin Films into Nanosized Patterns Using TiN Hard Mask," *Japanese Journal of Applied Physics* 45(40):L1080-L1083, 2006.

Yoon et al., "Etching Characteristics of $Ge_2Sb_2Te_5$ Using High-Density Helicon Plasma for the Nonvolatile Phase Change Memory Applications," *Japanese Journal of Applied Physics* 44:203-206, 2005. (w/ English Abstract).

Yoon et al., "Fabrication and electrical characterization of phase-change memory devices with nanoscale self-heating-channel structures," *Microelectronic Engineering* 85:2334-2337, 2008.

Yoon et al., "Large-area, scalable fabrication of conical TiN/GST/TiN nanoarray for low-power phase change memory," *Journal of Materials Chemistry* 22:1347-1351, 2012.

\* cited by examiner

ELECTRONIC COMPONENT MANUFACTURING METHOD

BACKGROUND

Technical Field

The present disclosure generally concerns electronic component manufacturing methods.

Description of the Related Art

Manufactured electronic components have increasingly small dimensions. Accordingly, modifications of the chemical composition of the materials of these components, due to manufacturing methods, have more and more impact on the operation and on the performance of the components. This is for examples true for phase-change memory devices.

Phase-change materials are materials which can switch, under the effect of heat, between a crystalline phase and an amorphous phase. Since the electric resistance of an amorphous material is significantly greater than the electric resistance of a crystalline material, such a phenomenon may be useful to define two memory states, for example, 0 and 1, differentiated by the resistance measured through the phase-change material. The most common phase change materials in memories are alloys made up of germanium, of antimony, and of tellurium.

A modification of the composition of the phase-change material of a memory cell may cause a decrease in the performance of the memory cell, for example, by decreasing the number of write cycles capable of being performed by the cell.

BRIEF SUMMARY

An embodiment provides a method of manufacturing an electronic component comprising a first step of etching at least one first layer followed, with no exposure to oxygen, by a second passivation step.

According to an embodiment, the electronic component is a phase-change memory cell.

According to an embodiment, the first layer is a layer of a phase-change material.

According to an embodiment, the material of the first layer is capable of being oxidized.

According to an embodiment, the material capable of being oxidized comprises germanium.

According to an embodiment, the first and second steps are carried out in a same enclosure by a same device.

According to an embodiment, the method comprises a third step of etching an element located under the first layer.

According to an embodiment, the element is a resistive element.

According to an embodiment, the second step is carried out during the third step.

According to an embodiment, the second step is carried out between the first and the third step.

According to an embodiment, the second step is carried out after the third step.

According to an embodiment, the second step is carried out after a step of removing an etch mask.

According to an embodiment, the passivation layer covers the walls of the element.

According to an embodiment, the passivation layer comprises carbon.

According to an embodiment, the gas is a compound comprising carbon and hydrogen or a compound comprising carbon, hydrogen, and fluorine.

According to an embodiment, the first layer is covered with a stack of at least one second layer, the second layer being a conductive layer.

The foregoing and other features and advantages will be discussed in detail in the following non-limiting description of specific embodiments in connection with the accompanying drawings.

DETAILED DESCRIPTION

Figure 1A:
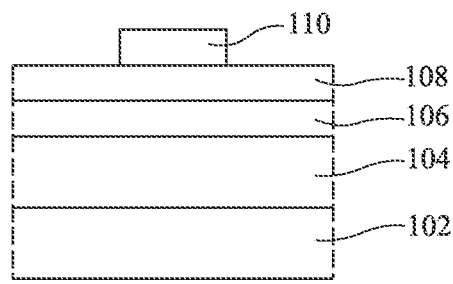
FIGS. 1A-1E schematically and partially show an embodiment of a phase-change memory cell manufacturing method.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, although FIGS. 1 and 2 only show the forming of an electronic component, here, a memory cell, it should be understood that the described embodiments are applicable to the simultaneous manufacturing of multiple components on a same wafer.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "substantially", and "approximately" are used herein to designate a tolerance of plus or minus 10%, preferably of plus or minus 5%, of the value in question.

Figure 1B:
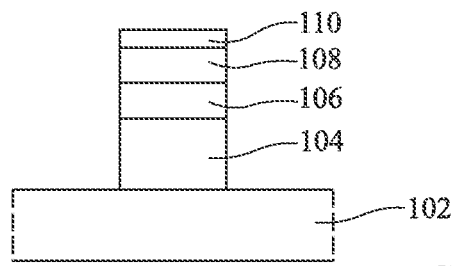
Figure 1C:
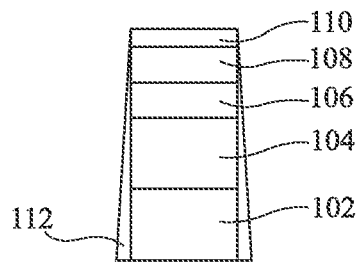
Figure 1D:
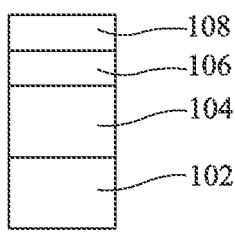
Figure 1E:
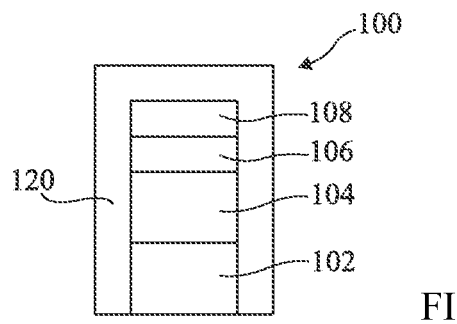

FIGS. 1A-1E schematically and partially show an embodiment of a method of manufacturing an electronic component, more particularly, a phase-change cell. FIGS. 1A-1E show five structures, each illustrating the result of one or more manufacturing steps, the structure shown in FIG. 1E representing a phase-change memory cell 100.

The structure shown in FIG. 1A is the result of steps including:
  forming a resistive element 102, for example, in contact with a conductive via, not shown;
  forming an insulating layer, not shown, surrounding resistive element 102, for example, to separate resistive element 102 from another neighboring resistive element;

forming a layer 104 of phase-change material on the insulating layer and preferably in contact with the upper surface of resistive element 102;

forming a conductive layer 106 covering phase-change material layer 104;

forming an insulating layer 108 covering conductive layer 106; and forming an etch mask 110 opposite the location where memory cell 100 will be located.

The insulating layer is formed in such a way that an upper surface of resistive element 102 is coplanar with the upper surface of the insulating layer.

Layer 104 of phase-change material is for example made of an alloy of germanium, of antimony, and of tellurium, preferably $Ge_2Sb_2Te_5$, or an alloy of germanium, of antimony, and of tellurium where the atomic proportion of germanium is greater than that of tellurium and of antimony. Conductive layer 106 is for example made of metal, for example, of a titanium-based alloy. Insulating layer 108 is for example made of silicon nitride. Mask 110 is for example made of a resin.

The thickness of resistive element 102, that is, for example, the distance between the via, not shown, having the resistive element and layer 104 of phase-change material resting thereon, is for example, in the range from approximately 40 nm to approximately 60 nm. The thickness of layer 104 of phase-change material is for example in the range from approximately 40 nm to approximately 60 nm. The thickness of conductive layer 106 is for example in the range from approximately 15 nm to approximately 30 nm. The thickness of insulating layer 108 is for example in the range from approximately 15 nm to approximately 30 nm. Mask 110 for example has a thickness in the range from approximately 250 nm to approximately 300 nm.

FIG. 1B depicts a sequence of etch steps removing the portions of layers 104, 106, and 108 unprotected by mask 110, among which a first etching, for example, performed last, is for example a plasma etching removing layer 104 of phase-change material, for example, with hydrogen bromide (HBr). The first etching is stopped on the upper surface of resistive element 102. The first etching partially etches mask 110, causing a decrease in the thickness thereof.

FIG. 1C depicts a second etching, removing the portions of resistive element 102 which are not protected by mask 110 and the portions of layers 104, 106, 108 remaining after the etching steps depicted in FIG. 1B.

The second etching is a plasma etching with a gas mixture, the gas used comprising a first compound used to etch resistive element 102 and a second compound used to form a passivation layer 112. The first compound is for example a gas comprising fluorine. The second compound is for example a gas comprising carbon, preferably a gas comprising carbon and hydrogen or a gas comprising carbon, hydrogen, and fluorine, preferably $CH_4$ or $CH_3F$.

In the case where the gas only comprises the first component, and not the second, the first component, more specifically fluorine, will tend to modify the composition of the phase-change material.

Passivation layer 112 covers the etched walls of the memory cell, that is, covers the walls of resistive element 102, and of layers 104, 106, and 108.

FIG. 1D depicts the removal of etch mask 110. The removal of etch mask 110 is generally performed by a specific step of oxygen-based plasma etching called "stripping". A disadvantage of such a step is that it generally causes, in the absence of passivation layer 112, the oxidation of a portion of layer 104 of phase-change material.

FIG. 1D also depicts the removal of passivation layer 112 and the removal (or cleaning) of the residues located on the walls of the memory cell, for example, under passivation layer 112. Since passivation layer 112 for example mainly comprises carbon, it is volatile and of low density. It is thus easy to remove it without affecting the integrity of the phase-change material. The cleaning step is preferably a wet etching treatment of "WET" type based on hydrogen fluoride and of glycolic acid.

FIG. 1E depicts the forming of a protection layer 120 on the memory cell and more particularly on the walls of layers 102, 104, 106, and 108 and on the upper surface of layer 108. Protection layer 120 is preferably made of silicon nitride and prevents the memory cell from being oxidized.

The steps depicted in FIGS. 1A-1C are carried out without the phase-change material being in contact with oxygen, for example, with air. For example, the steps depicted in FIGS. 1A-1C are carried out by a same etching machine and in a same enclosure, preferably under a controlled atmosphere.

Each of the steps depicted in FIGS. 1D-1E is generally carried out in a device different from that generally used for the steps depicted in FIGS. 1A-1C. The wafers having the memory cells formed thereon are thus exposed to air, and thus to oxygen, in the steps depicted in FIG. 1D. During the exposure to air, which may last for several hours, or even several days, layer 104 of the phase-change material is protected by passivation layer 112.

The performances of phase-change memory cells, as well as their characteristics, such as the crystallization temperature, depend on the composition of the phase-change material. Further, the performances of memory devices comprising said memory cells depend on the similarity between the different cells of the considered device. The phase-change material of the memory cells generally comprises a chemical element or alloy capable of being oxidized, particularly during periods of exposure to air or during the etch steps with a compound comprising oxygen or of being modified by the gas used during the etch steps, for example, the gas comprising fluorine used during the etching of the resistive element. Thus, without passivation layer 112 protecting layer 104 of phase-change material, the composition of the phase-change material, particularly at the wall level, would be modified. This would cause a decrease in the performance of the memory cell and of the memory devices comprising them. Further, such modifications would not be identical in all cells, which would cause a decrease in the performance of the memory device.

This problem is all the more significant as the memory cell size is small.

The thickness of passivation layer 112 at least partially depends on the nature of the second compound, on the parameters of the plasma etching, for example, the pressure, the acceleration voltage, the power, and the quantity of the second compound. It is thus possible to select the thickness of layer 112 according to the quantity of oxygen in contact with passivation layer 112. Indeed, passivation layer 112 is consumed little by little by the oxygen of air and its thickness should be sufficient not to be totally consumed.

Another solution could be to limit the time of exposure to air of layer 104 of phase-change material. However, the maximum time of exposure to oxygen for the memory cells to be functional, in the absence of a passivation layer, is not viable in an industrial manufacturing process.

According to another embodiment, a passivation layer may be independently formed at different times during the manufacturing of a memory cell. "Independently" means that the step during which the passivation layer is formed only forms this passivation layer. The obtained passivation layer then totally covers the structure. The forming of the passivation layer is preferably performed by the same device as the steps of etching the layer of phase-change material and the resistive element. The forming of the passivation layer is performed between the step of etching the layer of phase-change material and the exposure to air of the memory cell. The forming of the passivation layer is performed by means of a plasma for example comprising a gas comprising carbon, preferably a gas comprising carbon and hydrogen or a gas comprising carbon, hydrogen, and fluorine, preferably $CH_4$ or $CH_3F$.

The different times during which the passivation layer may be formed will be described hereafter, in relation with FIGS. 2A-2D.

FIGS. 2A-2D schematically and partially show another embodiment of a method of manufacturing an electronic component, more particularly a phase-change memory cell 800. FIGS. 2A-2D show four structures, each illustrating the result of one or more manufacturing steps.

Figure 2A:
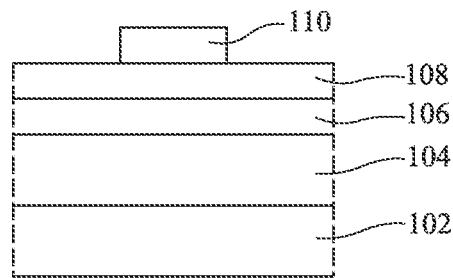
FIGS. 2A-2D schematically and partially show another embodiment of a phase-change memory cell manufacturing method.

The steps depicted in FIG. 2A are similar to those of FIG. 1A, and similarly comprise the forming of element 102, of layers 104, 106, and 108, and of mask 110.

Figure 2B:
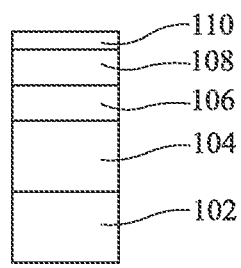

The steps depicted in FIG. 2B are similar to those of FIG. 1B and similarly comprise the etching of layers 104, 106, and 108. FIG. 2B further depicts a step of etching layer 102 by methods similar to those described in relation with FIG. 1C.

Figure 2C:
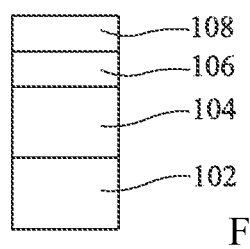

FIG. 2C depicts removing mask 110, for example, by a method similar to that described in relation with FIG. 1D.

Figure 2D:
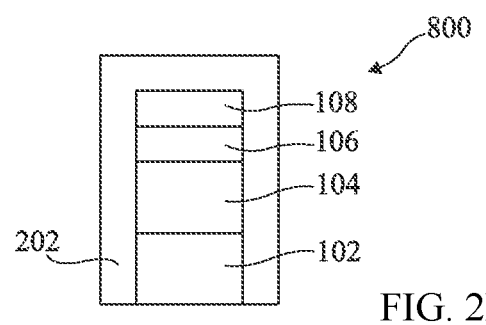

FIG. 2D depicts forming a passivation layer 202 covering the walls of resistive element 102, layers 104, 106, and 108 as well as the upper surface of layer 108. The forming of layer 202 is performed with a gas comprising a compound similar to the second compound described in relation with FIG. 1C. This compound is for example a gas comprising carbon, preferably a gas comprising carbon and hydrogen or a gas comprising carbon, hydrogen, and fluorine, preferably $CH_4$ or $CH_3F$.

Steps similar to steps depicted in FIGS. 1D-1E are then generally carried out.

Preferably, the steps of FIGS. 2A-2D are carried out without for phase-change material being in contact with oxygen, for example, with air. For example, the steps of FIGS. 2A-2D are carried out by a same etching machine and in a same enclosure, preferably, under a controlled atmosphere. The cell is generally exposed to air after the steps of FIG. 2D. During this period of exposure to air, which may last for several hours, or even several days, layer 104 of phase-change material is, as in the embodiment of FIG. 1C, protected by passivation layer 202 until the cleaning step is carried out (FIG. 1D).

As a variation, the passivating step of FIG. 2D may be carried out at other times during the memory cell manufacturing method. For example, the passivating step of FIG. 2D may be carried out between the etching of layer 104 of phase-change material and the etching of resistive element 102. The passivating step of FIG. 2D may also be carried out between the steps of FIGS. 2B and 2C. It is thus possible to expose the memory cells to air, during the method described in relation FIGS. 2A-2D. For example, it may be useful to stop the manufacturing process after the etching of layer 104 of phase-change material or after the etching of resistive element 102 and to store the memory cells. The presence of passivation layer 202 then prevents the oxidation of layer 104. The manufacturing process can then be resumed later on with no deterioration of the phase change material.

Passivation layer 202 may then be removed during a step similar to the steps of FIG. 1D.

As a variation, the embodiments of FIGS. 1A-2D may be combined in a same manufacturing method. Thus, a memory cell manufacturing method may comprise:

forming a passivation layer 112 (FIG. 1C) to protect layer 104 of phase-change material during the etching of resistive element 102 and during the "stripping" step; and forming a passivation layer 202, after the removal of mask 110 (FIG. 2D), having its thickness selected according to the time for which the cell should be able to remain in contact with oxygen without being deteriorated.

Although the present disclosure only details embodiment of phase-change memory cell manufacturing methods, the embodiments of the steps of manufacturing passivation layers 112 (FIG. 1c) and 202 (FIG. 2D) may be applied to other electronic component manufacturing methods. Said other embodiments comprise etching a first layer, for example, made of a material capable of being oxidized and corresponding to layer 104 of the previously described embodiments. The first layer covers an element, for example, resistive element 102. Said other embodiments further comprise the forming of a passivation layer (layer 112 or 202) on the walls of the first layer during the etching of the resistive element or between the etching of the first layer and the etching of the resistive element.

Various embodiments and variations have been described. Those skilled in the art will understand that certain features of these various embodiments and variations may be combined, and other variations will occur to those skilled in the art. In particular, a manufacturing method may comprise forming a plurality of passivation layers such as layers 112 and 202.

Finally, the practical implementation of the described embodiments and variations is within the abilities of those skilled in the art based on the functional indications given hereinabove.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   manufacturing an electronic component, the manufacturing including:
   etching a first layer;
   etching an element located under the first layer; and
   passivating the first layer between etching the first layer and etching the element, with no exposure to oxygen while etching and passivating the first layer.

2. The method of claim 1, wherein the electronic component is a phase-change memory cell.

3. The method of claim 1, wherein the first layer is a layer of a phase-change material.

4. The method of claim 1, wherein the first layer is of a material capable of being oxidized.

5. The method of claim 4, wherein the material capable of being oxidized comprises germanium.

6. The method of claim 1, wherein the etching and passivating steps are carried out in a same enclosure by a same device.

7. A method, comprising:
manufacturing an electronic component, the manufacturing including:
etching a first layer;
etching an element located under the first layer; and
passivating the first layer after etching the first layer, with no exposure to oxygen while etching and passivating the first layer, wherein the passivating is carried out during the etching of the element under the first layer.

8. The method of claim 7, wherein the passivating is carried out before removing an etch mask.

9. The method of claim 7, wherein the passivating comprises forming a passivation layer covering walls of the element.

10. The method of claim 7, wherein the passivating comprises forming a passivation layer comprising carbon.

11. The method of claim 7, wherein the passivating uses a gas that is a compound comprising carbon and hydrogen or a compound comprising carbon, hydrogen, and fluorine.

12. The method of claim 7, comprising covering the first layer with a stack of at least one second layer, the second layer being a conductive layer.

13. The method of claim 7, wherein the etching the first layer and the passivating the first layer are carried out in a same enclosure by a same device.

14. The method of claim 7, wherein the electronic component is a phase-change memory cell.

15. The method of claim 7, wherein the first layer is a layer of a phase-change material.

16. A method, comprising:
manufacturing phase change memory cell, the manufacturing including:
forming a phase change material layer on a resistive layer;
forming a mask layer on the phase change material layer;
etching the phase change material while the mask layer is on the phase change material layer;
passivating the phase change material layer with a passivating layer after etching the phase change material layer; and
removing the mask layer by oxygen-based plasma etching while the phase change material layer is protected by the passivating layer.

17. The method of claim 16, wherein the etching and passivating steps are carried out in a same enclosure by a same device.

18. The method of claim 16, comprising etching the resistive layer while passivating the phase change material layer with the passivating layer.

19. The method of claim 1, wherein the element is a resistive element.

* * * * *